United States Patent [19]
Phillips et al.

[11] 3,938,150
[45] Feb. 10, 1976

[54] MICROWAVE AMPLIFIER TUBE COHERENCY TEST SET

[75] Inventors: Chester C. Phillips, Rockville; William H. Zinger, Columbia; Robert F. Platte, Laurel; Melrose M. Jesurun, Silver Spring; Dennis H. Matthias, Columbia, all of Md.

[73] Assignee: The United States of America as represented by the Secretary of the Navy, Washington, D.C.

[22] Filed: June 25, 1974

[21] Appl. No.: 482,974

[52] U.S. Cl. .............................................. 343/17.7
[51] Int. Cl.² ........................................... G01S 7/40
[58] Field of Search .............................. 343/17.7

[56] References Cited
UNITED STATES PATENTS

| | | | |
|---|---|---|---|
| 3,024,460 | 3/1962 | Dahl et al. | 343/17.7 |
| 3,772,700 | 11/1973 | Belli | 343/17.7 |
| 3,794,999 | 2/1974 | Gellekink | 343/17.7 |

Primary Examiner—T. H. Tubbesing
Attorney, Agent, or Firm—R. S. Sciascia; Q. E. Hodges

[57] ABSTRACT

A test set for an amplifier or other electronic device in which a waveform generator furnishes a modulated RF signal to the item under test. Sensors extract samples of the RF signal at the item's input and output. A detector-mixer network compares and processes the input and output sample signals and produces signals at its output which are indicative of the phase distortion and amplitude distortion introduced by the item. The phase and amplitude distortion signals are sampled and held for each modulating signal pulse and are then processed to compile statistical data regarding the item's performance.

5 Claims, 2 Drawing Figures

3,938,150

MICROWAVE AMPLIFIER TUBE COHERENCY TEST SET

BACKGROUND OF THE INVENTION

New high power pulsed transmitters are an essential feature of most new search radar and track radar designs. Because these transmitters usually incorporate the most recent advances in component technology and because these components are generally subject to great operating stresses, transmitter development frequently presents one of the most troublesome areas in overall radar design. Such parameters as gain, bandwidth, output power and broadband noise are generally emphasized as measures of transmitter performance. Equally important narrowband parameters such as intrapulse noise and pulse-to-pulse coherence are relegated to a lower level. These latter two performance indicators, however, become increasingly important transmitter figures of merit as the radar system design becomes more critical.

The trend in radar design is toward coherent systems with complex modulations using such techniques as pulse compression, pulse doppler, and moving target indicator (MTI). These techniques require transmitter characterization in terms of its contribution to the system error budget when tested with the system waveform.

Two basic approaches have been used in the past to determine the contribution of the transmitter to the system signal processing error budget. The first of these requires the measurement of transmitter intrapulse noise by spectral analysis and the estimation of error budget contribution from these data. The second approach requires the complete radar system and the knowledge of the error budget contributions of the remainder of this system.

There are two basic approaches that have been used for performing a spectral analysis of the transmitter output. The most straightforward approach is analysis at the carrier frequency using an RF spectrum analyzer. The performance limitation of the test equipment is the greatest problem with this approach. Due to the low frequency resolution of RF spectrum analyzers, this RF approach has no value for intrapulse noise measurements, although it has been used to examine wideband transmitter noise effects.

The second spectral analysis approach both improves the resolution and provides isolation of the item under test from input signal instabilities. This procedure requires that the item, either a signal amplifier or a sequence of series gain stages, be inserted into a phase bridge as described in the article "The Measurement of Near-Carrier Noise in Microwave Amplifiers," by Klous H. Sann (IEEE Transactions on Microwave Theory and Techniques, Volume MTT-16, Sept. 9, 1968). The phase bridge approach reasonably satisfied dynamic range and resolution requirements but does not give an adequate system-oriented characterization of transmitter capability due to the difficulties encountered in translating the AM and PM noise spectra into system performance figures of merit such as MTI cancellation and due to the type of averaging required by the spectrum analysis. The long-term averaging requirement of the phase bridge approach obscures the pulse-to-pulse stability characteristics which are of prime importance, for example, to the MTI system.

SUMMARY OF THE INVENTION

The present invention provides results in a form that can be directly related to system performance and overcomes other problems associated with the past techniques which merely inferred performance dependent on transmitter pulse-to-pulse characteristics. The technique of the present invention permits direct measurement of transmitter intrapulse noise and pulse-to-pulse coherence. By applicants' novel invention, signal amplitude and phase distortion are preserved by a homodyne detection process that resolves the signal into in-phase (I) and quadrature-phase (Q) components relative to a reference which is a sample of the input to the item under test. Although this RF processing is like the prior art basic phase bridge approach, it has the very important distinctions that in-phase and quadrature-phase components are recorded simultaneously and that data are collected on a pulse-by-pulse basis. Since power amplifier characteristics are highly sensitive to DC supply variations, provision is also made to sample and store supply voltage simultaneously with the detected RF signal.

STATEMENT OF THE OBJECTS OF THE INVENTION

Accordingly, it is the primary object of this invention to provide a novel coherency testing device.

It is another object of the invention to provide a testing device which is capable of providing information regarding the test item's performance on a pulse-to-pulse basis.

Other objects, advantages and novel features of the invention will become apparent from the following detailed description of the invention when considered in conjunction with the accompanying drawings wherein.

DESCRIPTION OF THE PREFERRED EMBODIMENT

Figure 1:
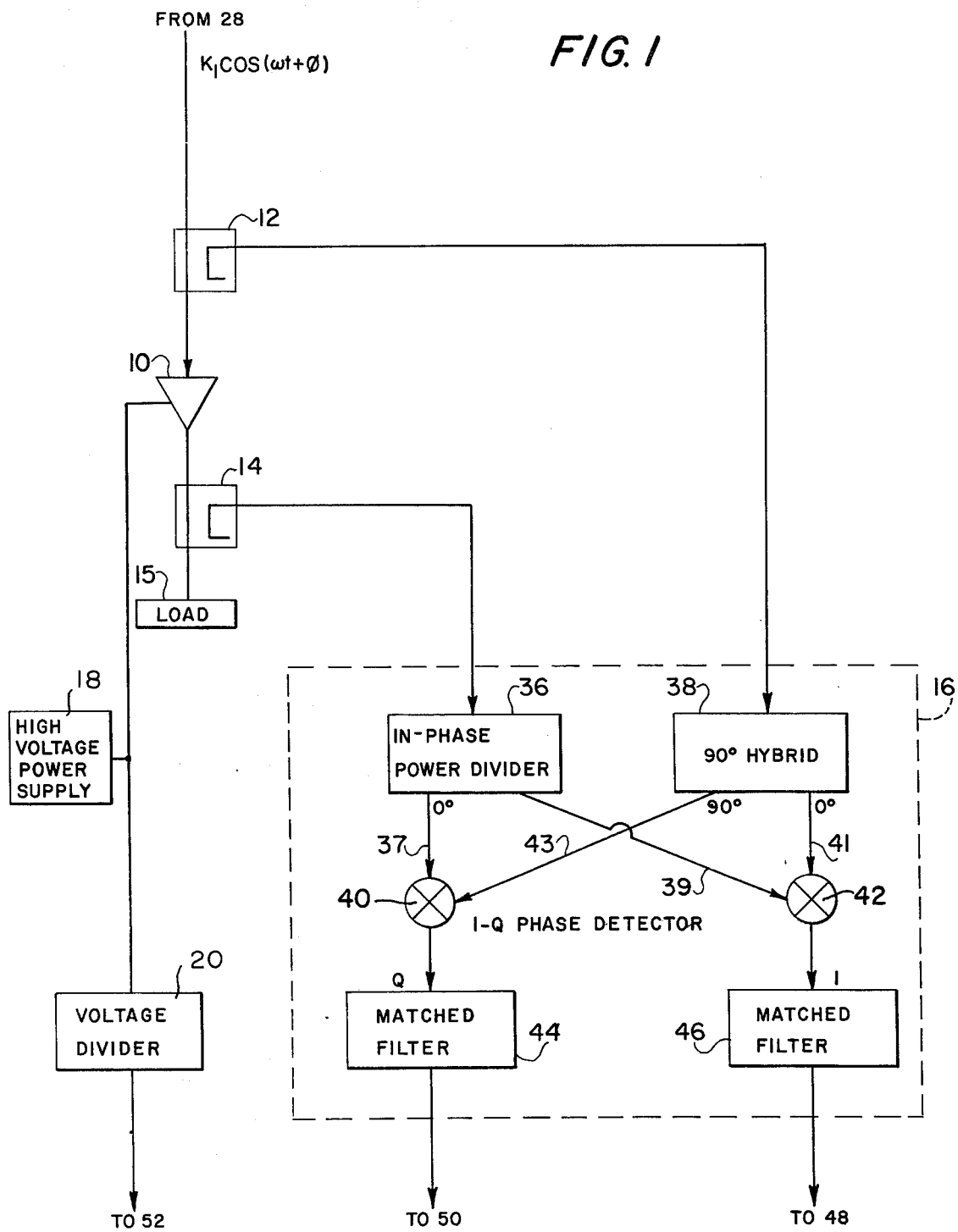
FIG. 1 is a network diagram of a test item and signal sampling network.

As illustrated in FIG. 1, the test device of the present invention provides a technique for measuring the coherency and stability of a test item 10 under simulated operating conditions. Item 10 may comprise, for example, a cross field amplifier (CFA), a series of gain stages, or any other transmitter or transmitter component for which the amplitude and phase stability characteristics are of interest. Applicants' invention is also adaptable for testing of waveguides. Test item 10 receives operating power from high voltage power supply 18 for energization of a suitable load 15.

Figure 2:
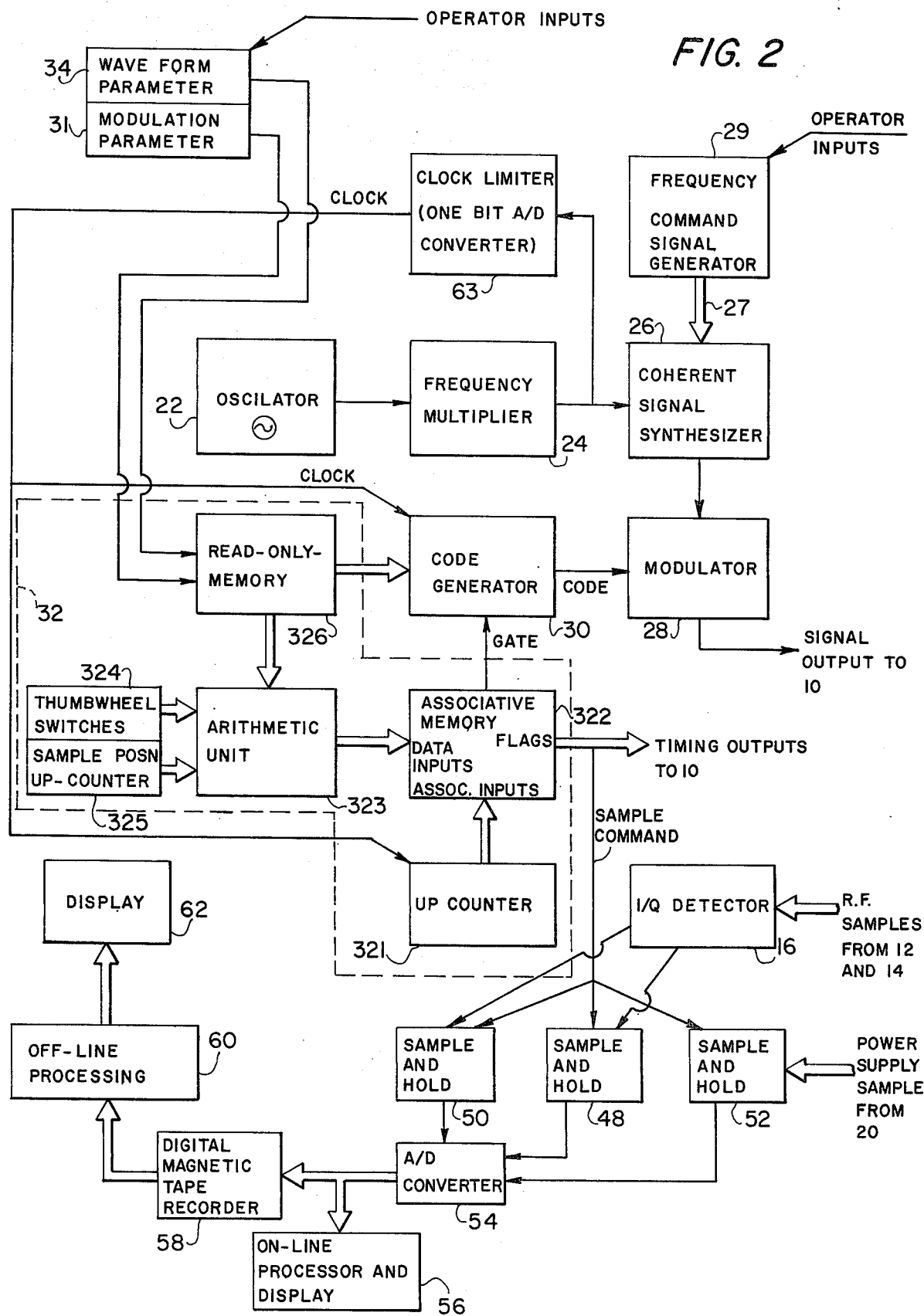
FIG. 2 is a network diagram of the reference signal generator, the timing and processing circuitry of the present invention.

Item 10 receives the selected test signal comprising a modulated RF signal from the output of modulator 28 illustrated in FIG. 2. Samples of the input signal to item 10 are extracted by directional coupler 12 and samples of the output of the test item are extracted by directional coupler 14. The signals provided by sensors 12 and 14 are furnished to first and second inputs of I-Q phase detector 16 which resolves the fluctuations in the output signal of test item 10 with respect to the input signal and isolates the amplitude and phase distortion introduced by the test item from the energizing carrier frequency by reducing the signals supplied by sensors 12 and 14 into in-phase and quadrature-phase vector components at its two outputs. Sample and hold networks 48 and 50 (FIG. 2) receive the signals from the I and Q ports of the phase detector 16 and, as directed by the sample command signal from timing unit 32 (FIG. 2), are gated on at the appropriate time to store the response of the test item 10 to each test pulse. The vector components stored in networks 48 and 50 and the signal stored in sample and hold network 52 are then sequentially converted to digital data by A/D converter 54 and sequentially recorded on magnetic tape unit 58 for off-line computer processing. A limited amount of on-line processing is also provided to permit instant evaluation of the level of test item performance during data collection by data processor and display unit 56. Computer 60 processes the data which is then recorded on plotter 62 for visual display. Since power amplifier characteristics are highly sensitive to supply variations, the sample and hold network 52 is also provided for storing reduced signal level samples of the supply voltage simultaneously with the detected RF pulse as monitored and supplied by voltage divider 20. Computer 60 (FIG. 2) may be programmed to provide information such as power supply average and rms percent variation, clutter attenuation and rms variation, clutter attenuation hystograms, and clutter attenuation and rms variation modified by phase pushing factor and power supply data. Obviously, however, the computer program will depend upon the particular item under test and the particular stability information desired.

Referring to FIG. 2, oscillator 22, which may, for example, comprise a temperature controlled or temperature compensated oscillator, provides a highly time stable reference signal to frequency multiplier 24. The frequency multiplier 24 shifts the oscillator output frequency up to the required logic clock signal frequency and may comprise a diode bridge multiplier, class C transistor type multiplier or any other suitable frequency multiplier.

The logic clock signal frequency provided by multiplier 24 is split between an input to coherent signal synthesizer 26 and clock limiter 63 which converts the zero mean value sine wave to levels appropriate for the logic. In response to a frequency command signal on line 27 supplied by frequency command signal generator 29 which may comprise coded toggle switches and/or a number entry keyboard, coherent signal synthesizer 26 generates on command one of n carrier frequency signals with fractional frequency stability comparable to the oscillator 22. Modulator 28 inserts the amplitude and/or phase modulation on to the selected carrier frequency signal supplied by coherent signal synthesizer 26. Modulator 28 may provide simple pulse modulation for amplitude; or for phase, no phase modulation, binary modulation and linear phase modulation or any combination thereof.

Timing unit 32, illustrated in FIG. 2 by dotted lines utilizes the clock signal to provide the appropriate timing signals to the code generator 30, sample and hold networks 48, 50 and 52 and, if necessary, a pretrigger to test item 10. To commence operation, the operator enters through waveform parameters generator 34 a waveform code indicating pulse width and interpulse period and through modulation parameters generator 31 a modulation parameters code; 34 and 31 may, for example, comprise well known coded toggle switches and/or a number entry keyboard. A read-only memory unit 326 such as model HPROM 0512 manufactured by Harris Semiconductor receives the coded information from 31 and 34 and translates this waveform code into a control data input for code generator 30 which may comprise a shift register sequence generator, thus enabling 30 to select the desired modulation code for modulator 28, and into timing data which is furnished to arithmetic unit 323 which is capable of binary addition and subtraction and is of well known design, e.g. Texas Instruments model SN 74181. Thumbwheel switches 324 provide vernier control on waveform timing as stored in memory 326 via arithmetic operations unit 323. Time offset values entered by switches 324, for example, may be added to or subtracted from the values stored in memory 326 element 325 is a binary synchronous counter of conventional design. Counter 325 functions to determine the beginning point in the time interval for the sampling for each sample. Associative memory 322 stores the final results of the arithmetic operations performed by unit 323. Timing unit 32 counts the clock signal provided by frequency multiplier 24 and limiter 63 in the up-counter 321. On coincidence between the number contained in the up-counter 321 and the data stored in associative memory 322, sample commands for the sample and hold networks 48, 50 and 52 are generated by associative memory unit 322, i.e. at a time corresponding to the leading edge, trailing edge or an intermediate point on the modulation pulse as determined by the operator through a data entry at item 31. The operator identifies the desired sample point from a pre-established relationship between the time position on the test pulse and one of plurality of sample position number switches on unit 31. For example, a first sample position number switch may correspond to the pulse leading edge. Other sample position number switches will correspond to intermediate points on the test pulse and to the test pulse trailing edge depending on the length of the RF waveform selected. The initiation signal for the code generator 30 and any timing required by the item 10 under test are also generated by unit 322. When code generator 30 receives the activation signal from associative memory 322, it generates the amplitude and/or phase modulation code signal to modulator 28. Code generator 30 is operated from the same clock as the timing circuitry thereby insuring that the modulation is synchronized properly with the sample timing. Associative memory 322 stores the time at which a sample command signal is to appear as dictated to it by the signal output from 323 so that when the up-counter 321 clock time reaches the sample command time an association is formed in unit 322 and a sample command is generated. Likewise, memory 322 generates signals at the appropriate time for the code generator 30 and the item 10 under test. Associative memories of this type are commercially available such as model FJB93402 manufactured by Fairchild Semiconductor.

I-Q phase detector 16 illustrated in FIG. 1 includes two power dividers, 36 and 38. In-phase power divider 36 recieves the sample signal from sensor 14 and provides two equal amplitude signals with 0° phase difference at outputs 37 and 39. Power divider 38 receives the sample signal from sensor 12 and provides two equal amplitude signals with 90° phase difference, the signal at output 43 being phase shifted 90° from the signal at output 41. Multiplier 40 receives two input signals, one from in-phase power divider 36 and one from the hybrid power divider 38. Similarly, multiplier 42 receives two input signals, one from the in-phase power divider 36 and the other from the 90° hybrid power divider 38. Filters 44 and 46 are matched to the modulation bandwidth and are designed to eliminate the carrier frequency and all higher frequency signal components at the outputs of the multipliers 40 and 42. The outputs of the matched filters 44 and 46 are subsequently furnished to sample and hold networks 50 and 48 respectively.

For illustrative purposes, the operation of the I-Q phase detector is described as follows. The signal input to the test item 10 may be represented as $K_1\cos(\omega t+\phi)$. The sample taken by the input directional coupler is then $$K(t)\cos(\omega t), \qquad (1)$$

assuming for simplicity that $\phi=0$. The sample taken by the output directional coupler 14 may then, be represented by $$[K_2(t) + \beta(t)] \cos [\omega t + \alpha(t)] \qquad (2)$$

where $\beta(t)$ = the amplitude distortion introduced by the item under test and $\alpha(t)$ = the phase distortion introduced by the item under test. The output on line 43 of power divider 38 is thus $$\tfrac{1}{2}K(t)\sin(\omega t) \qquad (3)$$

and the output on line 41 of power divider 38 is $$\tfrac{1}{2}K(t)\cos(\omega t). \qquad (4)$$

The output on each of lines 37 and 39 of power divider 36 is $$\tfrac{1}{2}[K_2(t)+\beta(t)] \cos [\omega t+\alpha(t)]. \qquad (5)$$

Consequently, the output of multiplier 42 which is the product of the signals on lines 39 and 41 is $$\tfrac{1}{2}K(t)\cos(\omega t)\tfrac{1}{2}[K_2(t)+\beta(t)] \cos [\omega(t)+\alpha(t)] \qquad (6)$$

$$\tfrac{1}{8}[K(t)\{K_2(t)+\beta(t)\}]\{\cos [2\omega t+\alpha(t)] + \cos - \alpha(t)]\}. \qquad (7)$$

Since filter 46 attenuates the carrier frequency and all higher frequency terms the output of filter 46 is $$\tfrac{1}{8}K(t)[K_2(t)+\beta(t)] \cos\beta(t) \qquad (8)$$

Similarly, the input to multiplier 40 on line 43 is $$\tfrac{1}{2}K(t)\sin(\omega t) \qquad (9)$$

and the input to multiplier 40 from power divider 36 output line 37 is the same as that in equation (2) above. The output of multiplier 40 is, therefore, $$\tfrac{1}{2}K(t)\sin(\omega t)\tfrac{1}{2}[K_2(t)+\beta(t)] \cos [\omega(t)+\alpha(t)] \qquad (10)$$

or $$\tfrac{1}{8}[K(t)\{K_2(t)+\beta(t)\}]\{ \sin [2\omega t+\alpha(t)] + \sin - \alpha(t)]\}. \qquad (11)$$

Again since filter 44 attenuates the carrier frequency and all higher frequencies the output of filter 44 is $$-\tfrac{1}{8}K(t)[K_2(t)+\beta(t)] \sin \alpha(t). \qquad (12)$$

It can readily be seen now that $\beta(t)$ and $\alpha(t)$ are calculable by suitable computer programming. For instance, a mere division of equation (12) by equation (8) yields $-\tan\alpha(t)$, the negative inverse function of which is $\alpha(t)$. Similarly, $\beta(t)$ is readily calculable.

Thus, for each modulating pulse to the test item 10 a signal is stored in sample and hold circuits 48 and 50 which signals are representative of the amplitude and phase distortion introduced by the test item 10. By selecting appropriate waveform parameters for waveform parameter generator 34 and appropriate modulation parameters for modulation parameters generator 31 and by proper timing, statistical data regarding the coherency of test item 10 during turn-on, steady-state, and turn-off conditions may be obtained and compiled. Since in radar systems, matching of transmitter output pulses is critical, the present invention provides a novel technique for predicting the target detection performance of a particular system. It should be understood, moreover, that although the instant invention has been described in terms of pulse-to-pulse analysis, the invention obviously could be used for CW analysis.

Obviously many modifications and variations of the present invention are possible in the light of the above teachings. It is therefore to be understood that within the scope of the appended claims the invention may be practiced otherwise than as specifically described.

What is claimed is:

1. An apparatus for testing the coherency of an electronic device including an input and an output comprising:
    pulse means connected to the input of said electronic device for energizing said electronic device with an input series of pulses;
    first means coupled between said pulse means and said electronic device input for providing a first signal indicative of the input to said electronic device;
    second means coupled to the output of said electronic device for providing a second signal indicative of the output of said electronic device;
    detector means having first and second detector inputs and first and second detector outputs;
    said first detector input being coupled to said first means such that said detector means receives said first signal and said second detector input being coupled to said second means such that said detector means receives said second signal;
    whereby in response to said input series of pulses, a first series of signals are present at said first detector output and a second series of signals are present at said second detector output;
    means for storing each of said first series of signals and each of said second series of signals;
    a first power divider connected to said first means for providing a first power divider signal and a second divider signal which is 90° phase shifted from said first power divider signal; and
    a second power divider connected to said second means for providing third and fourth power divider signals.

2. The apparatus of claim 1 wherein said detector means further includes:
    a first mixer for receiving said first and third power divider signals; and
    a second mixer for receiving said second and fourth power divider signals.

3. The apparatus of claim 2 wherein:
    said input series of pulses comprises a modulated carrier frequency signal; and
    said detector means further includes first and second filters connected to said first and second mixers respectively for attenuating all signal frequencies above the carrier frequency of said modulated carrier frequency signal, the outputs of said first and second filters comprising said first and second detector outputs;
    whereby each of said first and second series of signals are indicative of the amplitude and phase distortion introduced by said electronic device for each corresponding pulse of said series of pulses.

4. The apparatus of claim 1 wherein said means for storing comprises first sample and hold means for receiving and storing the series of signals from said first detector output, second sample and hold means for receiving and storing the series of signals from said second detector output;

said apparatus further including timing means for activating said first and second sample and hold means and said pulse means.

5. The apparatus of claim 1 further including:
a power supply connected to said electronic device;
said means for storing comprising first sample and hold means for receiving the series of signals from said first detector output, second sample and hold means for receiving the series of signals from said second detector output, third sample and hold means connected to said power supply for receiving signals indicative of the power supply coherency during each of said input series of pulses, and timing means for activating said first, second and third sample and hold means.

* * * * *